(12) United States Patent
Sander

(10) Patent No.: US 7,570,721 B2
(45) Date of Patent: Aug. 4, 2009

(54) APPARATUS AND METHOD FOR MULTI-PHASE DIGITAL SAMPLING

(75) Inventor: Wendell B. Sander, Los Gatos, CA (US)

(73) Assignee: Panasonic Corporation, Osaka (JP)

( * ) Notice: Subject to any disclaimer, the term of this patent is extended or adjusted under 35 U.S.C. 154(b) by 664 days.

(21) Appl. No.: 11/282,322

(22) Filed: Nov. 18, 2005

(65) Prior Publication Data
US 2007/0071142 A1   Mar. 29, 2007

Related U.S. Application Data

(60) Provisional application No. 60/719,991, filed on Sep. 23, 2005.

(51) Int. Cl.
*H04L 27/06* (2006.01)
(52) U.S. Cl. .............. 375/343; 375/354; 375/355; 375/360; 375/371; 375/373; 375/374; 375/375; 375/376
(58) Field of Classification Search ............ 375/354, 375/355, 360, 368, 371, 373, 374, 375, 376
See application file for complete search history.

(56) References Cited

U.S. PATENT DOCUMENTS

| 4,876,699 | A | 10/1989 | Nelson |
| 5,761,254 | A | 6/1998 | Behrin |
| 7,190,754 | B1 * | 3/2007 | Chang et al. ................. 375/373 |

| 2002/0168043 | A1 | 11/2002 | Sander |
| 2004/0008763 | A1 * | 1/2004 | Fredriksson ................. 375/224 |
| 2004/0208270 | A1 * | 10/2004 | Schmatz et al. ............. 375/355 |
| 2006/0050827 | A1 * | 3/2006 | Saeki et al. ................. 375/362 |

FOREIGN PATENT DOCUMENTS

| EP | 0 434 293 A2 | 6/1991 |
| EP | 0 439 178 A1 | 7/1991 |

OTHER PUBLICATIONS

So, H.C. et al., "Comparison of Various Periodograms for Single Tone Detection and Frequency Estimation", 1997 IEEE International Symposium on Circuits and Systems, Jun. 9-12, 1997, pp. 2529-2532, Hong Kong, China.
International Search Report issued in International Application No. PCT/JP2006/319397, dated May 8, 2007.

* cited by examiner

*Primary Examiner*—Chieh M Fan
*Assistant Examiner*—Siu M Lee
(74) *Attorney, Agent, or Firm*—McDermott Will & Emery LLP

(57) ABSTRACT

A method and apparatus for determining a relationship between an input signal frequency and a reference signal frequency is envisioned. The system derives a plurality of internal reference signals from the reference signal. The internal reference signals are provided to a level detection circuit which in turn samples the input signal a number of times within a period of time. Values associated with these samples are stored, as is one value of a sample from a previous period. The stored samples are correlated, and a relationship between the input signal frequency and the reference signal frequency is derived.

6 Claims, 20 Drawing Sheets

APPARATUS AND METHOD FOR MULTI-PHASE DIGITAL SAMPLING

CROSS-REFERENCE TO RELATED APPLICATIONS

This application claims priority to U.S. Provisional Patent Application No. 60/719,991 for "APPARATUS AND METHOD FOR MULTI-PHASE DIGITAL SAMPLING" filed on Sep. 23, 2005, which is incorporated herein by reference in its entirety.

FIELD

The present invention relates to signal sampling in an electronic circuit. In particular, the invention relates to measuring an input frequency relative to a reference signal.

BACKGROUND

In many applications, a waveform needs to be sampled to determine its characteristics, including its frequency or phase. Several basic solutions are available to these questions. In one typical solution, analog components are used to obtain a comparison that includes both a magnitude and sign of a difference between an input and a reference signal. However, this typical solution suffers from the disadvantage that the analog components have a lack of precision in the comparison since the components have inherent timing limitations, including non-standard response and/or delay times.

In other typical solutions, digital logic components are used. However, when performing the frequency comparison, these typical digital solutions do not provide a linear output (i.e. an indication of how much higher or lower the input is to the reference.)

SUMMARY

A method of determining a relationship between an input signal frequency and a reference signal frequency is envisioned. The reference frequency has a first period associated with it. A plurality of internal reference signals are derived from the reference signal, where each of the internal reference signals is characterized by each of the internal reference signals temporally offset from one another and occurring within the first period. The plurality of internal reference signals are relayed to a level detection circuit. Based upon a characteristic of the internal reference signals, a level detection circuit samples the input signal at a plurality of times within the first period. The values associated with the samples is then stored. At least one value associated with a sampled level of the input signal from a previous period is also stored. The sampled levels from the first period are correlated amongst themselves, and the value associated with a sampled level of the input signal from a previous period is correlated with one of the sampled levels from the current period. A relationship between the input signal frequency and the reference signal frequency is then derived. This derivation is based in part on: a) the correlation of the sampled signal levels from the first period; and b) the correlation of at the value associated with the previous period with one from the current period.

In addition, a circuit for determining a relationship between an input signal having a first frequency on an input port and a reference signal having a second frequency on a reference port is envisioned. The circuit contains an internal timing signal generator coupled to the reference port. The internal timing signal generator can generate multiple signals at specific points in time within a first period of time. The first period of time is related to the reference signal frequency. A plurality of signal level detectors are each coupled to an output of the internal timing signal generator, and to the input port. Each of the signal level detectors can sample the input signal at a first point in time based upon an output of the internal timing signal generator, and each can output a value associated with the sampled input signal. The first point in time is within the first period. A time alignment circuit is coupled to the plurality of signal level detectors, and is operable to store the first values from the plurality of signal detectors. A storage circuit is available to store a value associated with a sampled input signal from a second point in time previous to the first period. A correlator circuit is coupled to the time alignment circuit and the storage circuit. The correlator can correlate the first values from the first period amongst themselves and correlate the value associated with a sampled input signal from the previous point in time with one of from the first period.

DESCRIPTIONS OF THE FIGURES

The accompanying drawings, which are incorporated into and constitute a part of this specification, illustrate one or more embodiments of the present invention and, together with the detailed description, serve to explain the principles and implementations of the invention.

Figure 8A:
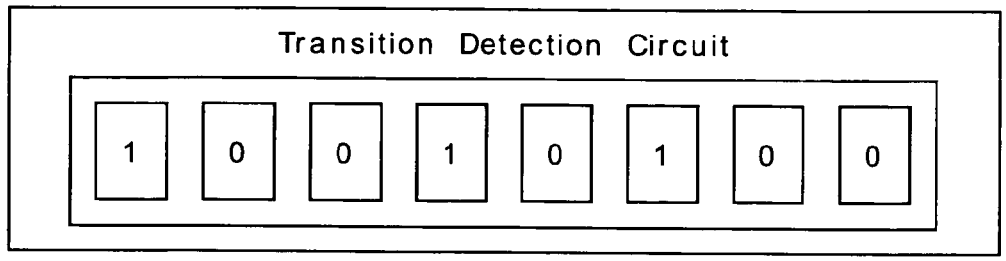
Figure 8A:
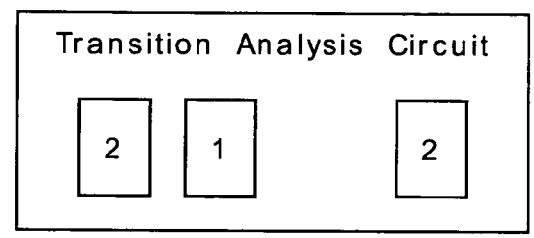
Figure 8B:
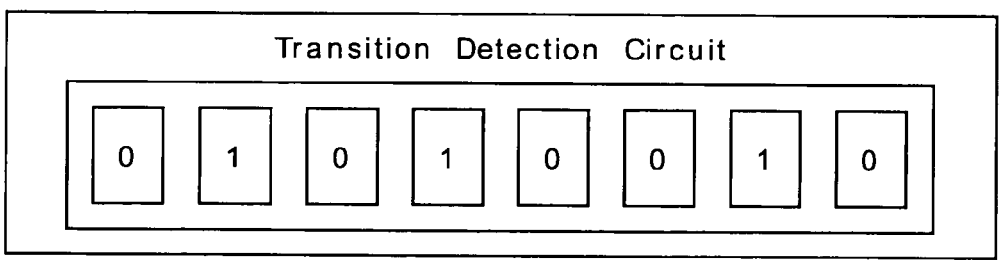
Figure 8B:
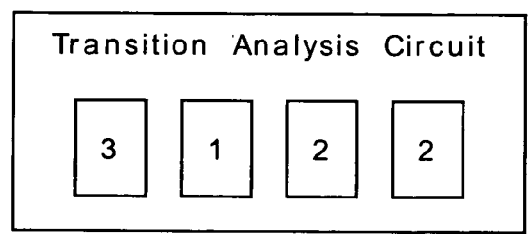

FIGS. 8a-b are block diagrams of an embodiment of the interaction between a result of the transition detection circuit and a transition analysis circuit.

Figure 9:
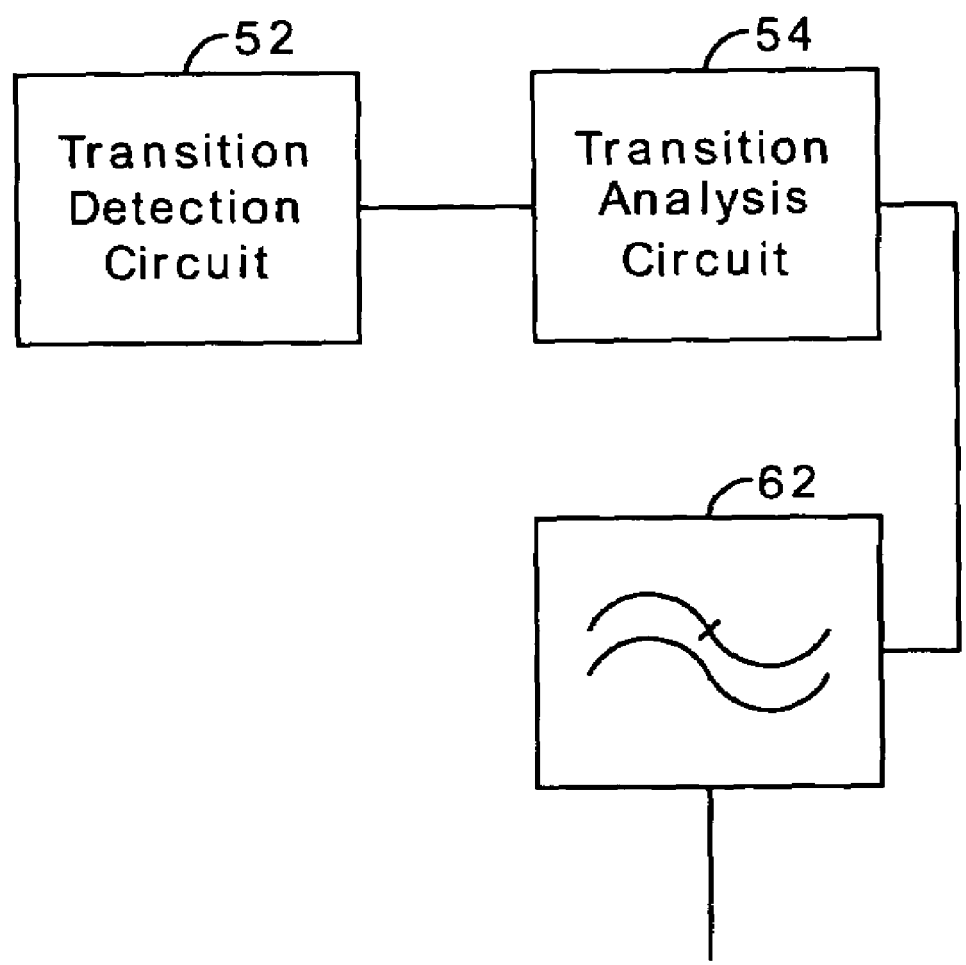

FIG. 9 is a schematic block diagram of the transition detection and analysis circuits used in conjunction with a low-pass filter.

Figure 10:
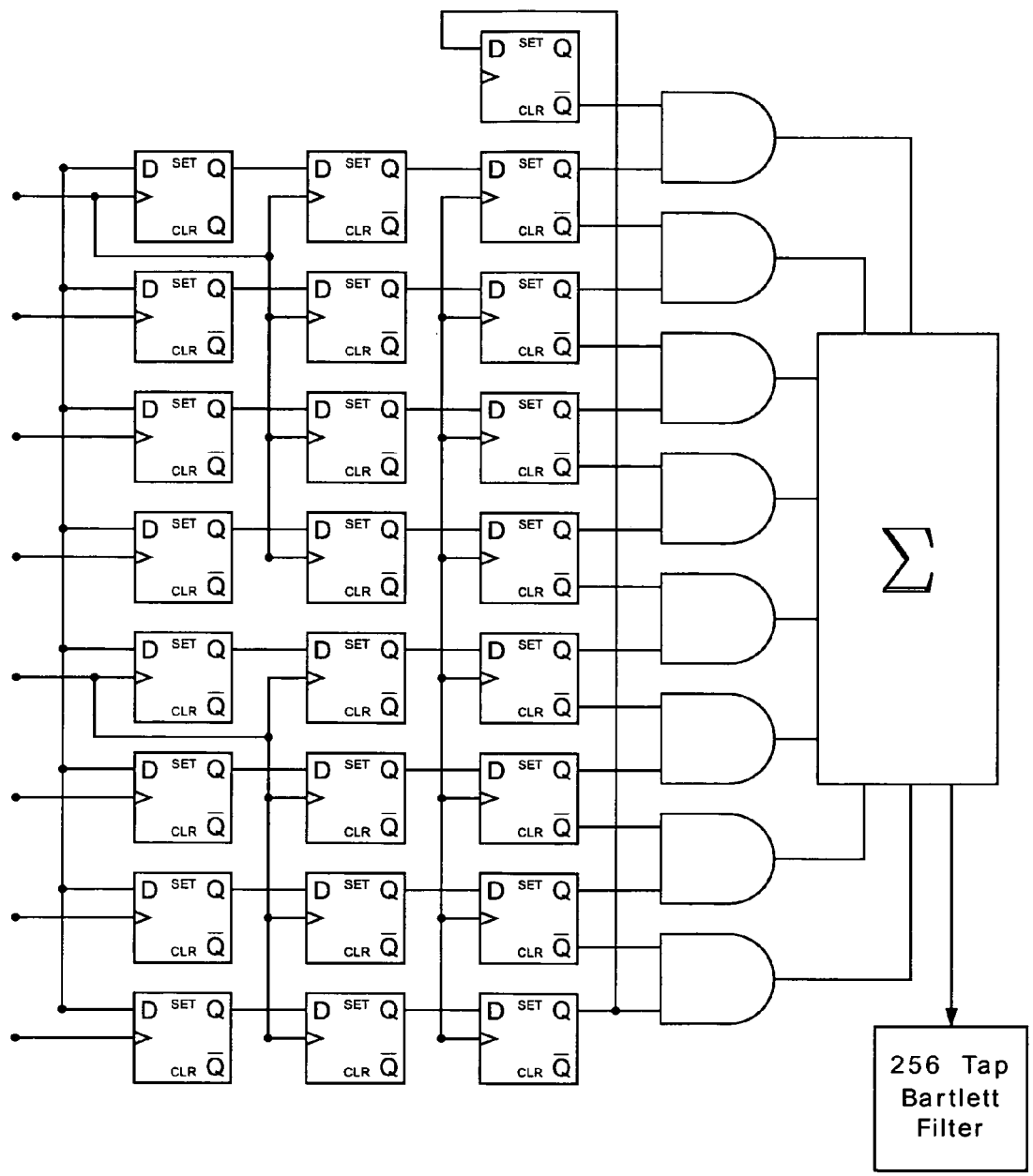

FIG. 10 is a schematic diagram of a specific embodiment of an apparatus that determines an input frequency.

Figure 11:
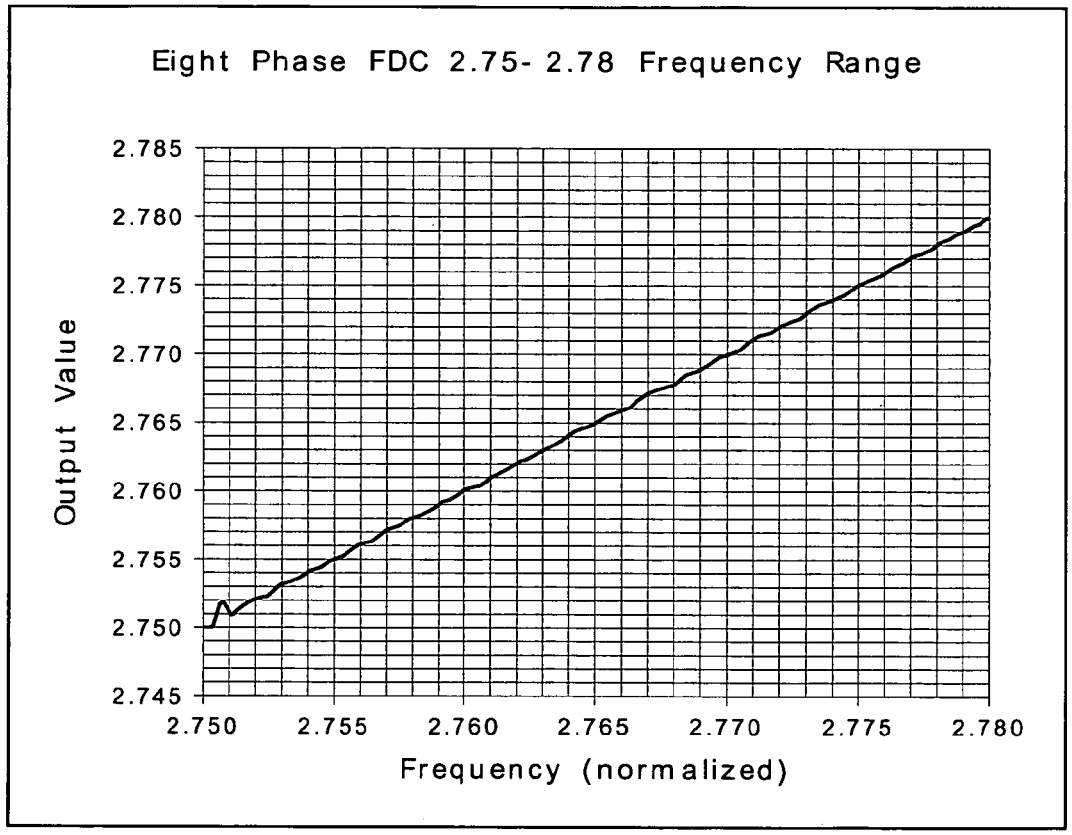

FIG. 11 is a graph detailing an exemplary output of FIG. 10.

Figure 12:
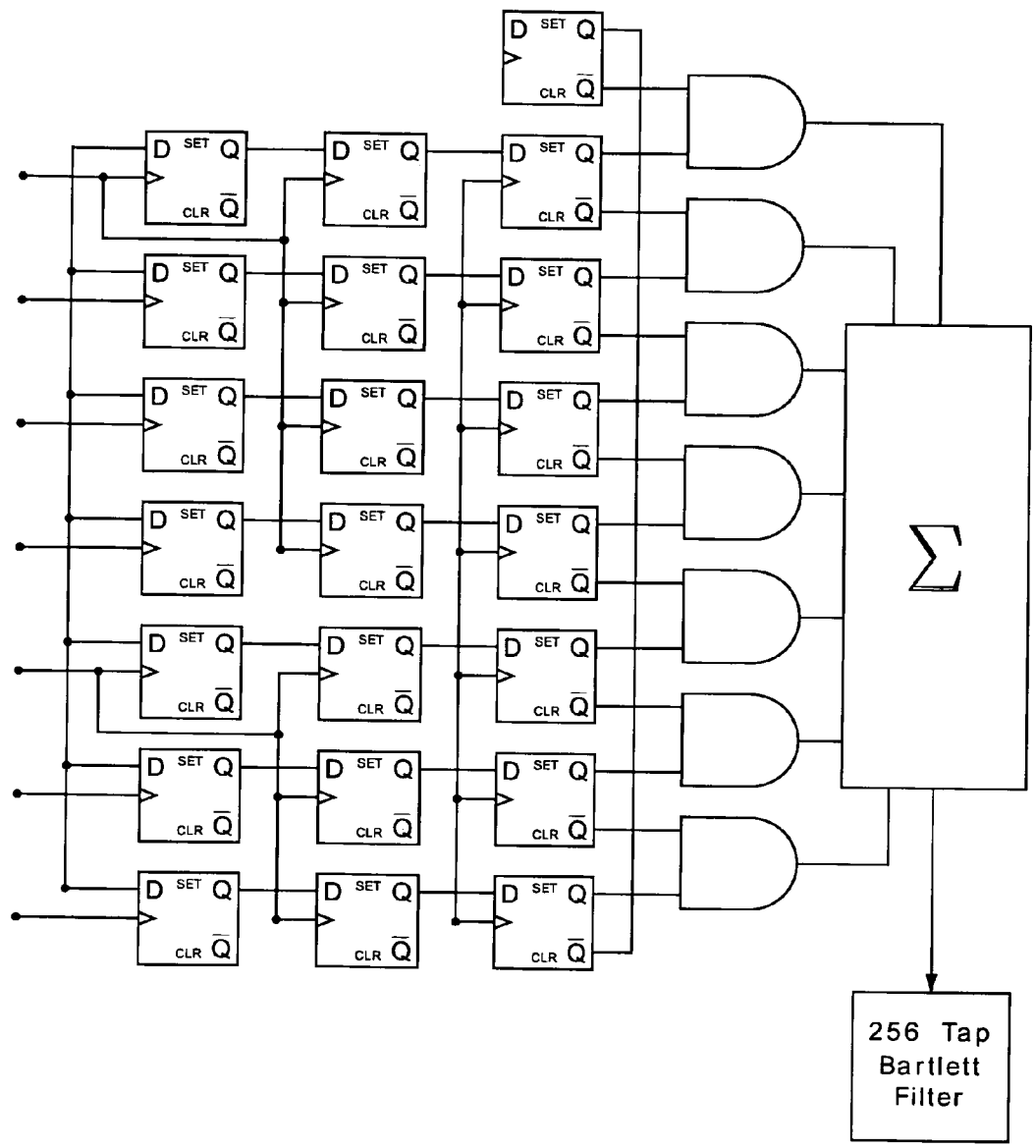

FIG. 12 is a schematic diagram of another specific embodiment of an apparatus that determines an input frequency.

Figure 13:
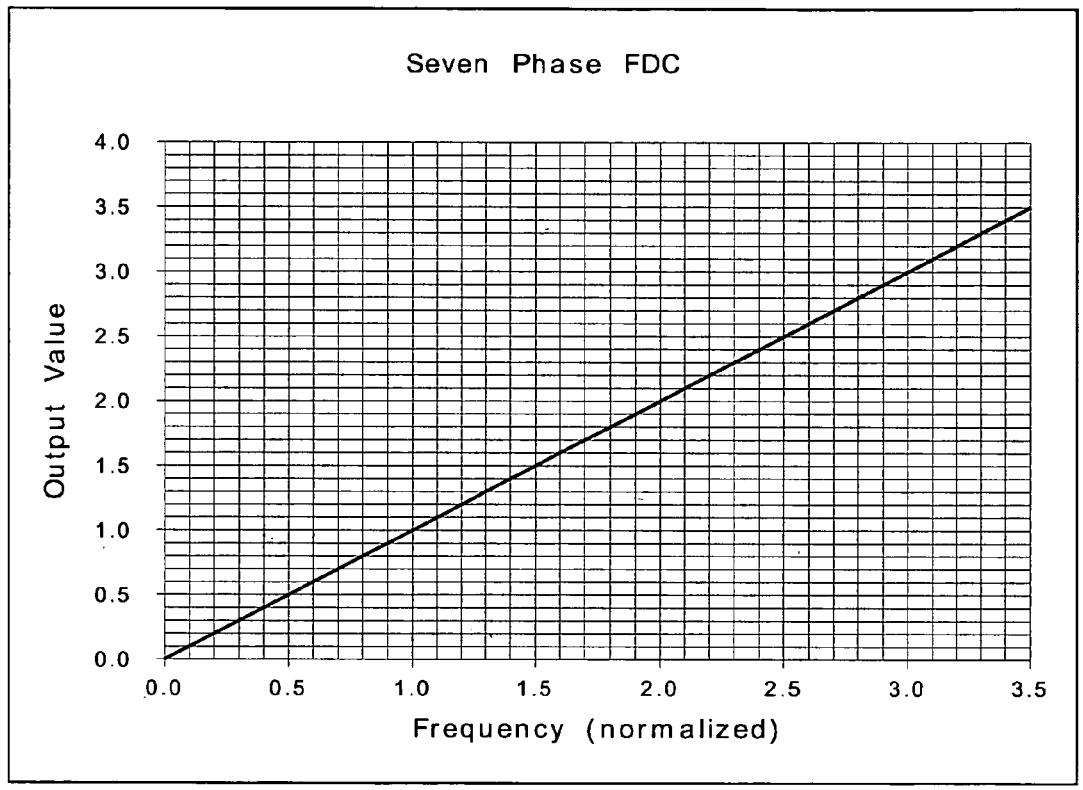

FIG. 13 is a graph of an exemplary output for the seven phase system depicted in FIG. 12.

Figure 14:
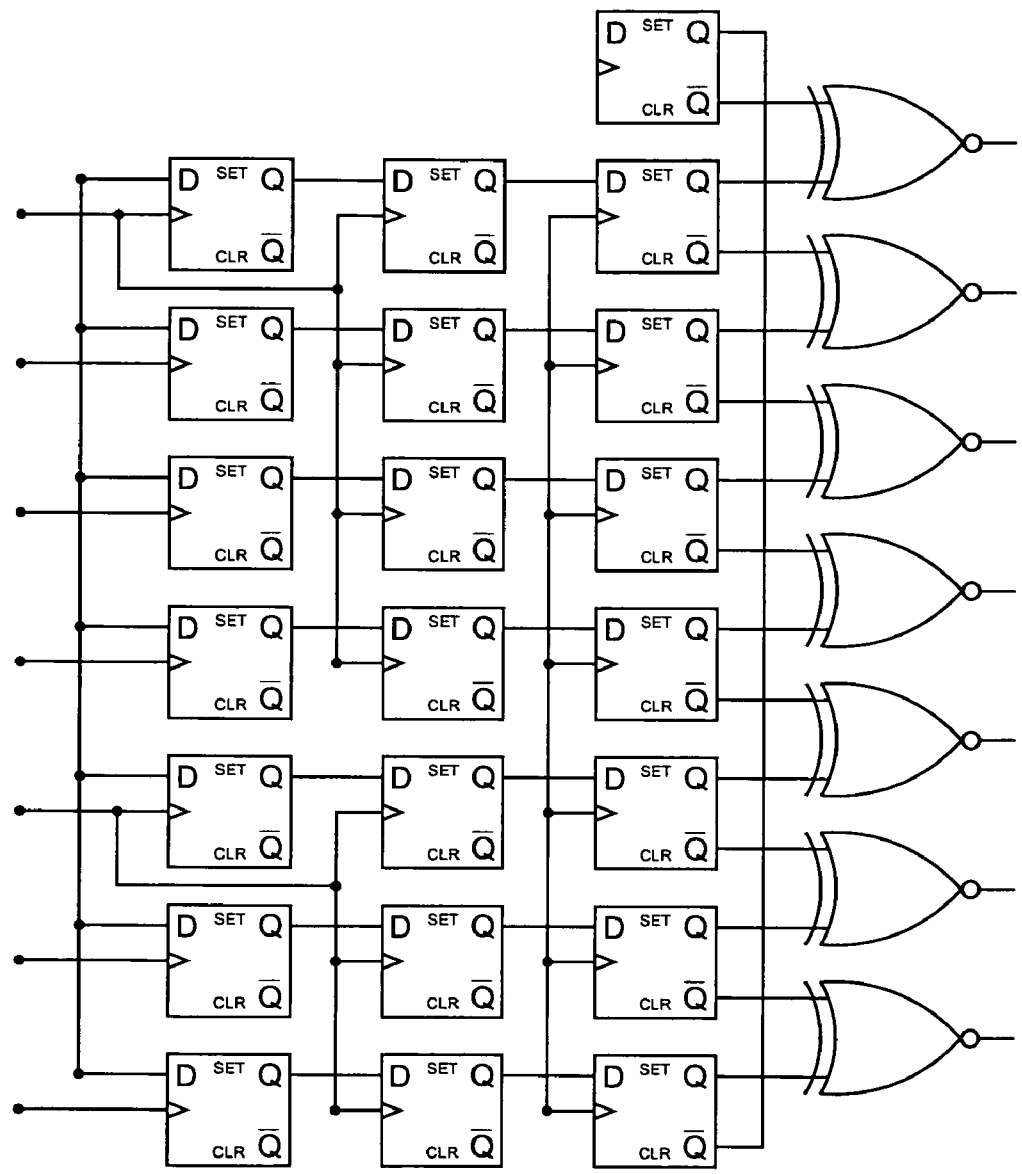

FIG. 14 is a schematic diagram of yet another embodiment of a transition detection/frequency comparator wherein both the up and the down transitions are used.

Figure 15:
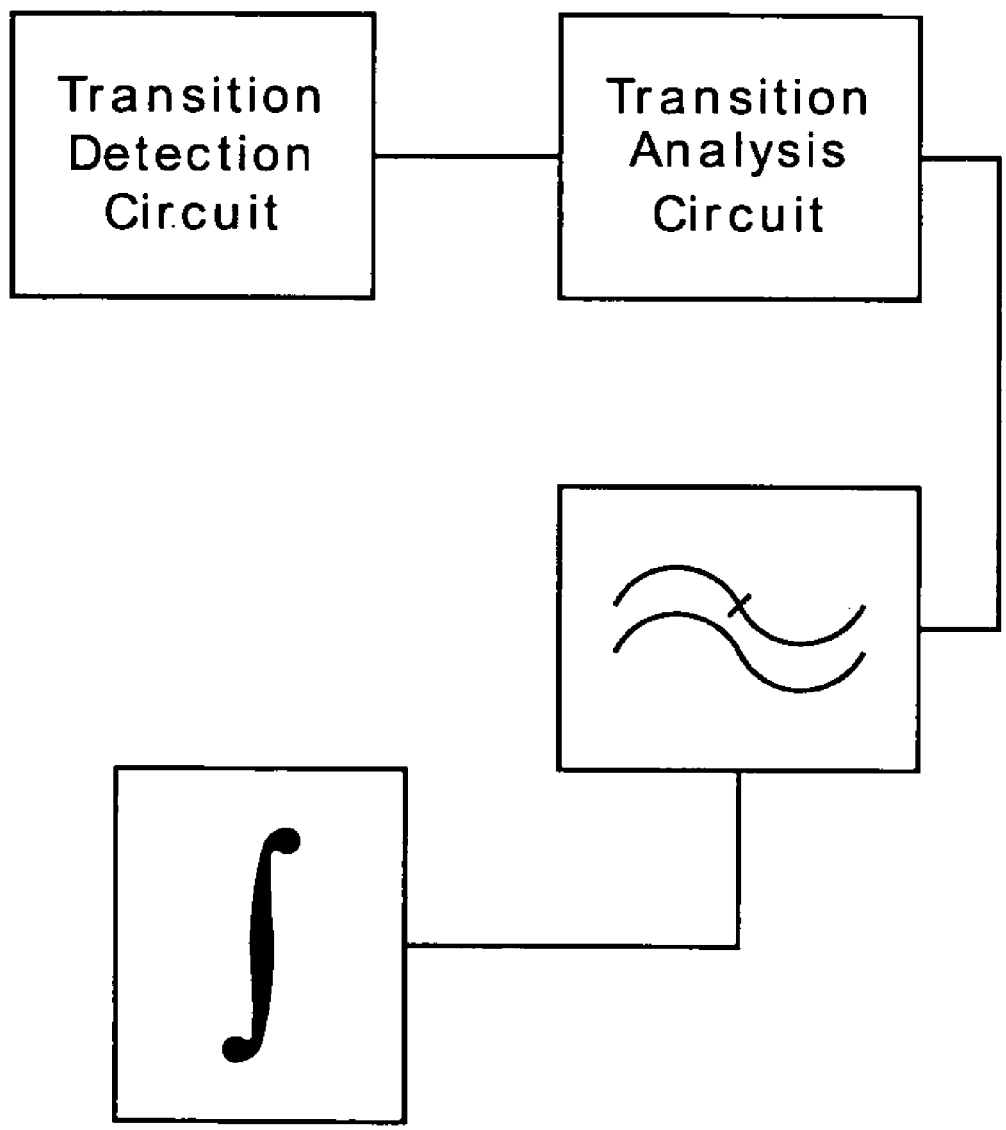

FIG. 15 is schematic block diagram of a frequency comparator coupled to an integration circuit.

Figure 16:
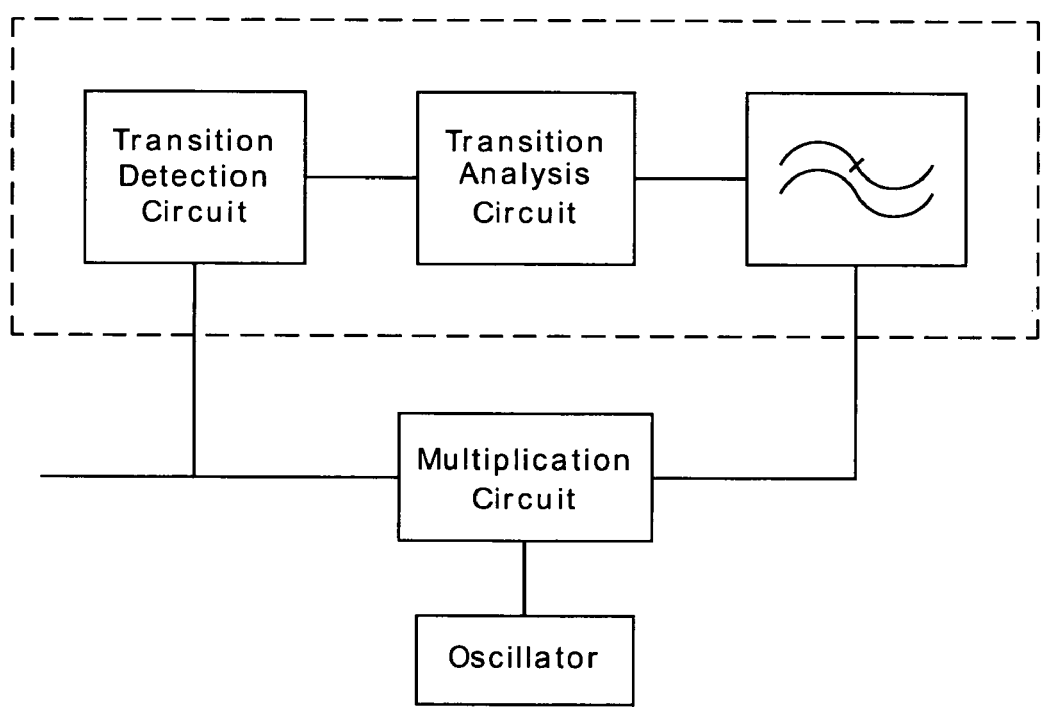
Figure 17A:
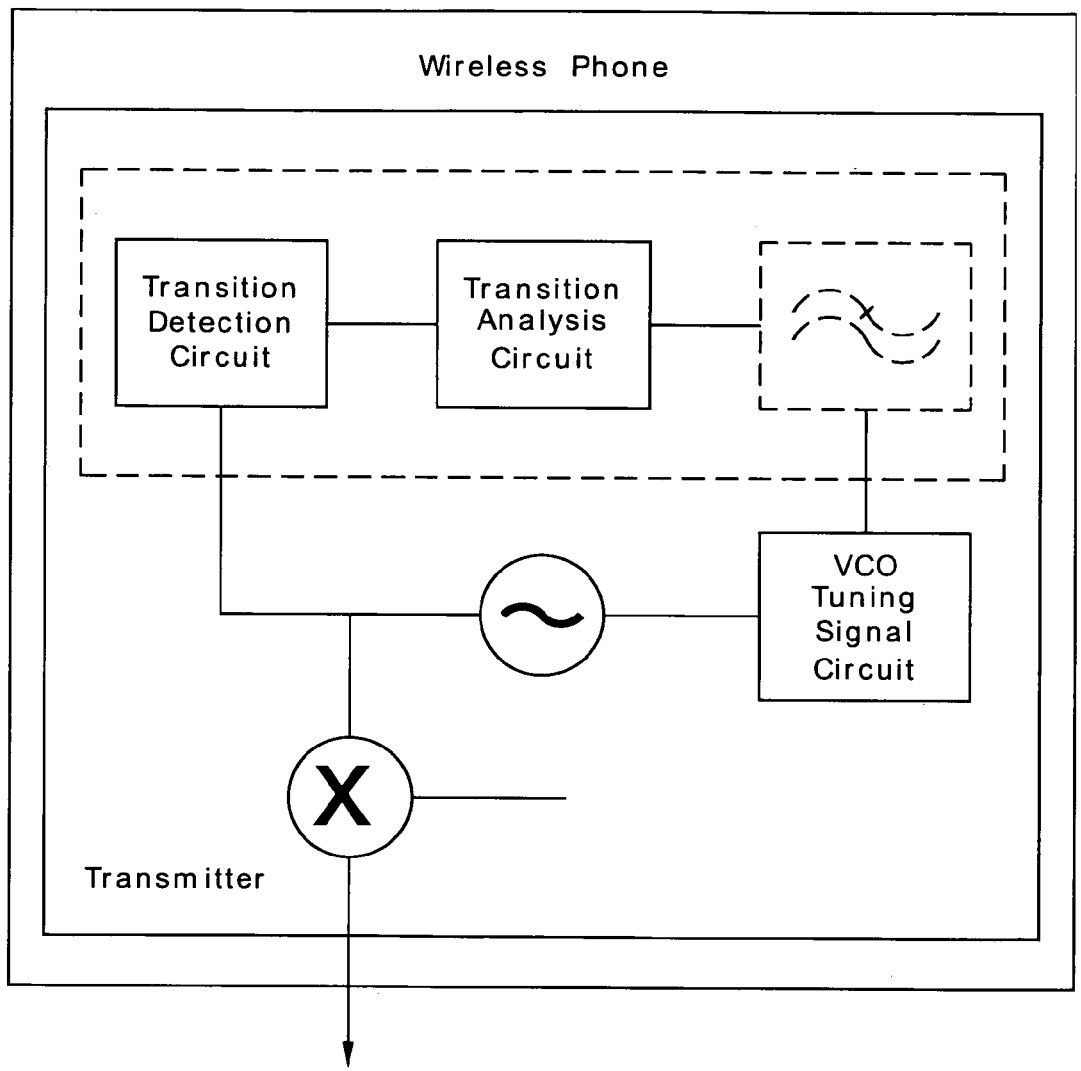
Figure 17B:
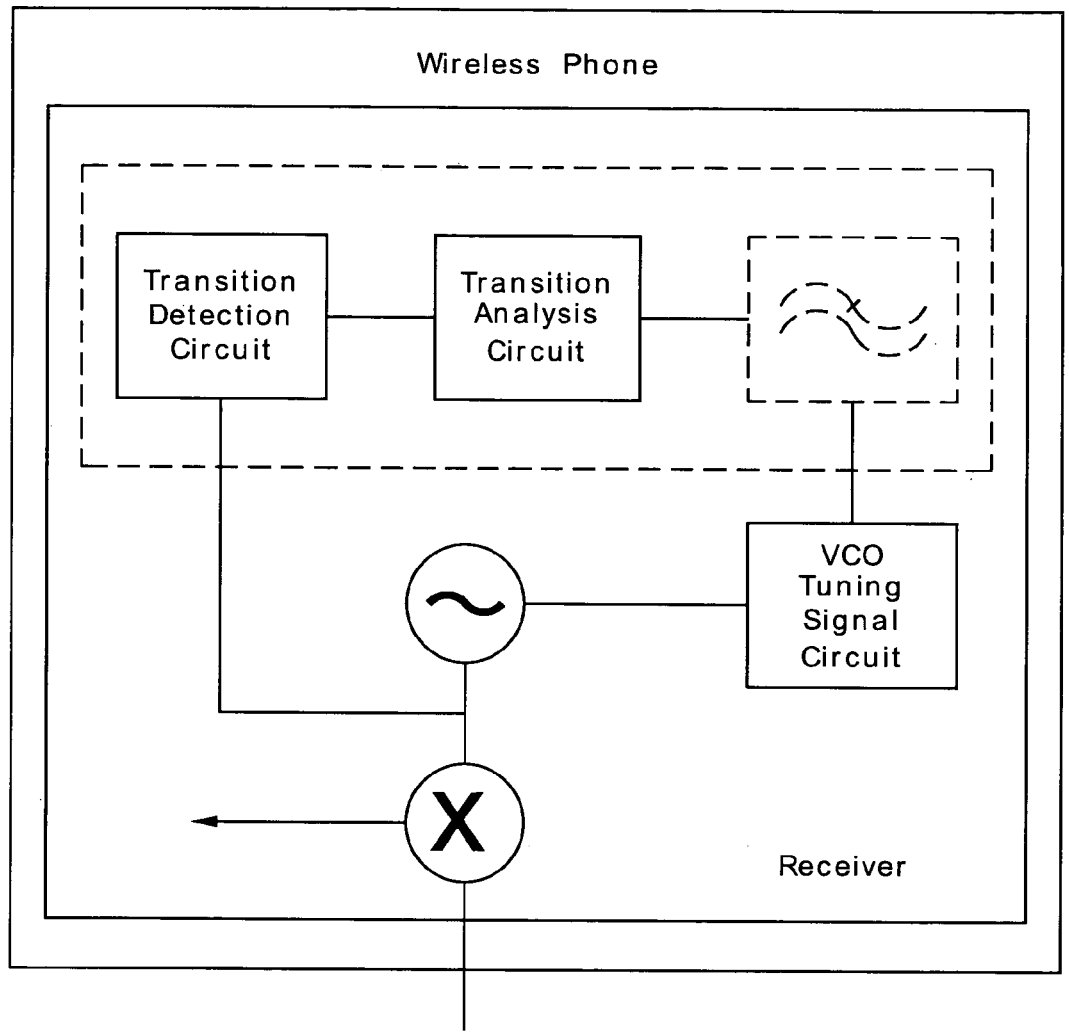

FIG. 16 is a schematic block diagram of a frequency comparator in a frequency synthesizer FIGS. 17a-b are schematic block diagrams detailing the use of the circuits in place in wireless apparatuses.

Figure 18A:
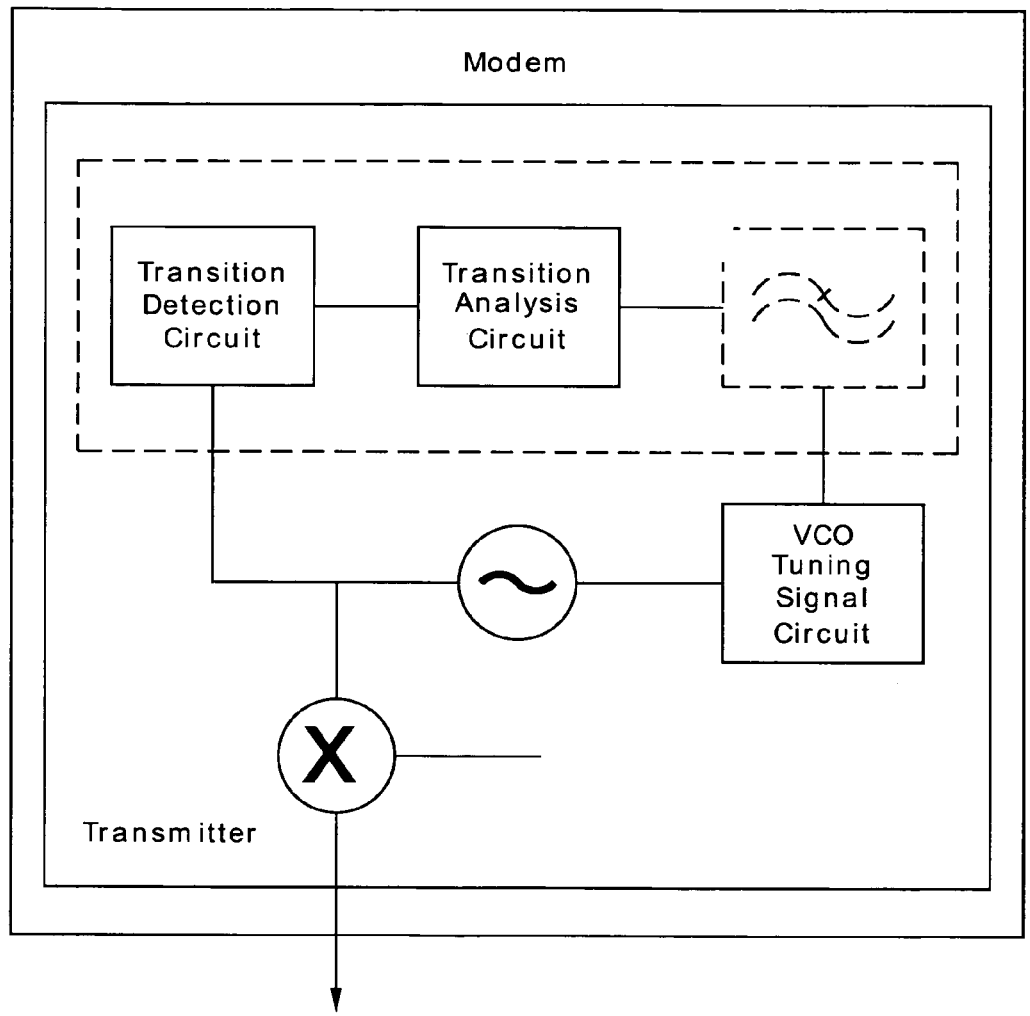
Figure 18B:
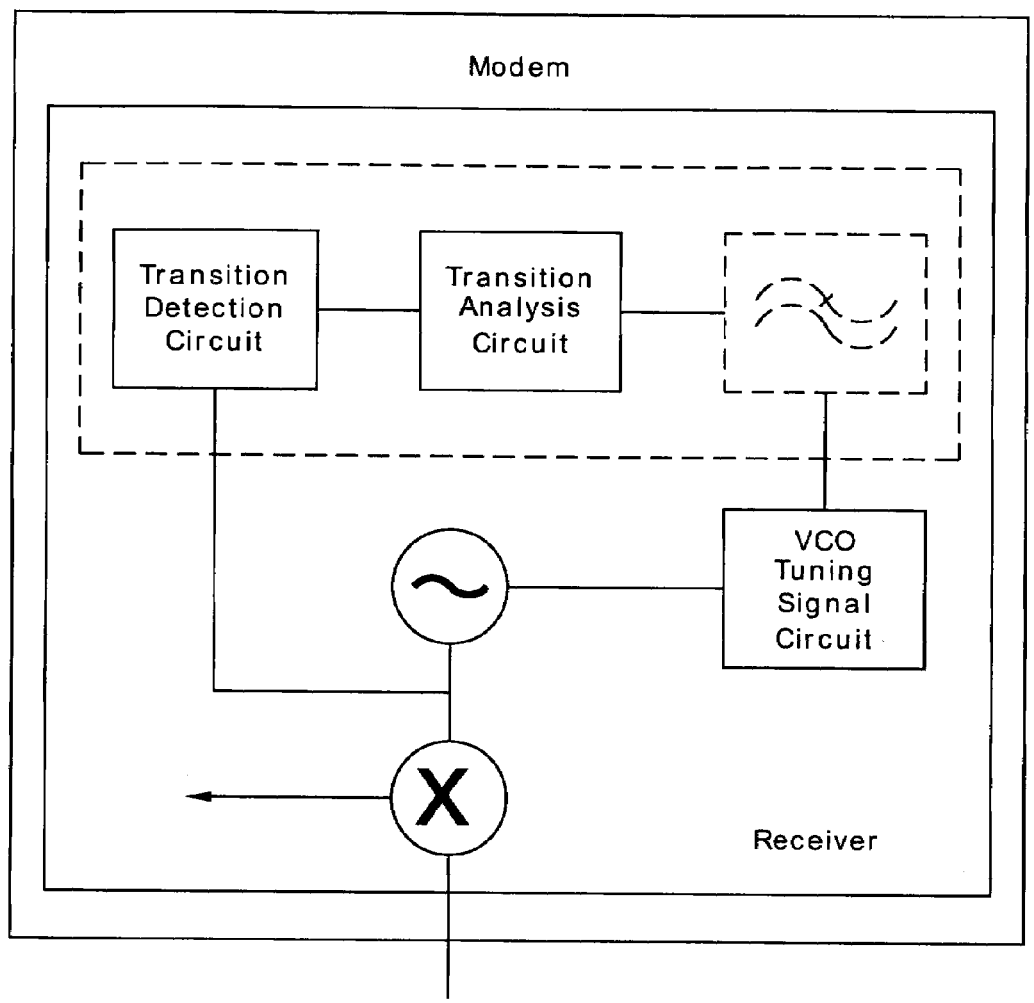

FIGS. 18a-b are schematic block diagrams detailing the use of the circuits in place in modems.

DETAILED DESCRIPTION

Embodiments of the present invention are described herein in the context of an apparatus and method for determining an input frequency. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of digital systems, including hardware, software, or any combination thereof. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1:
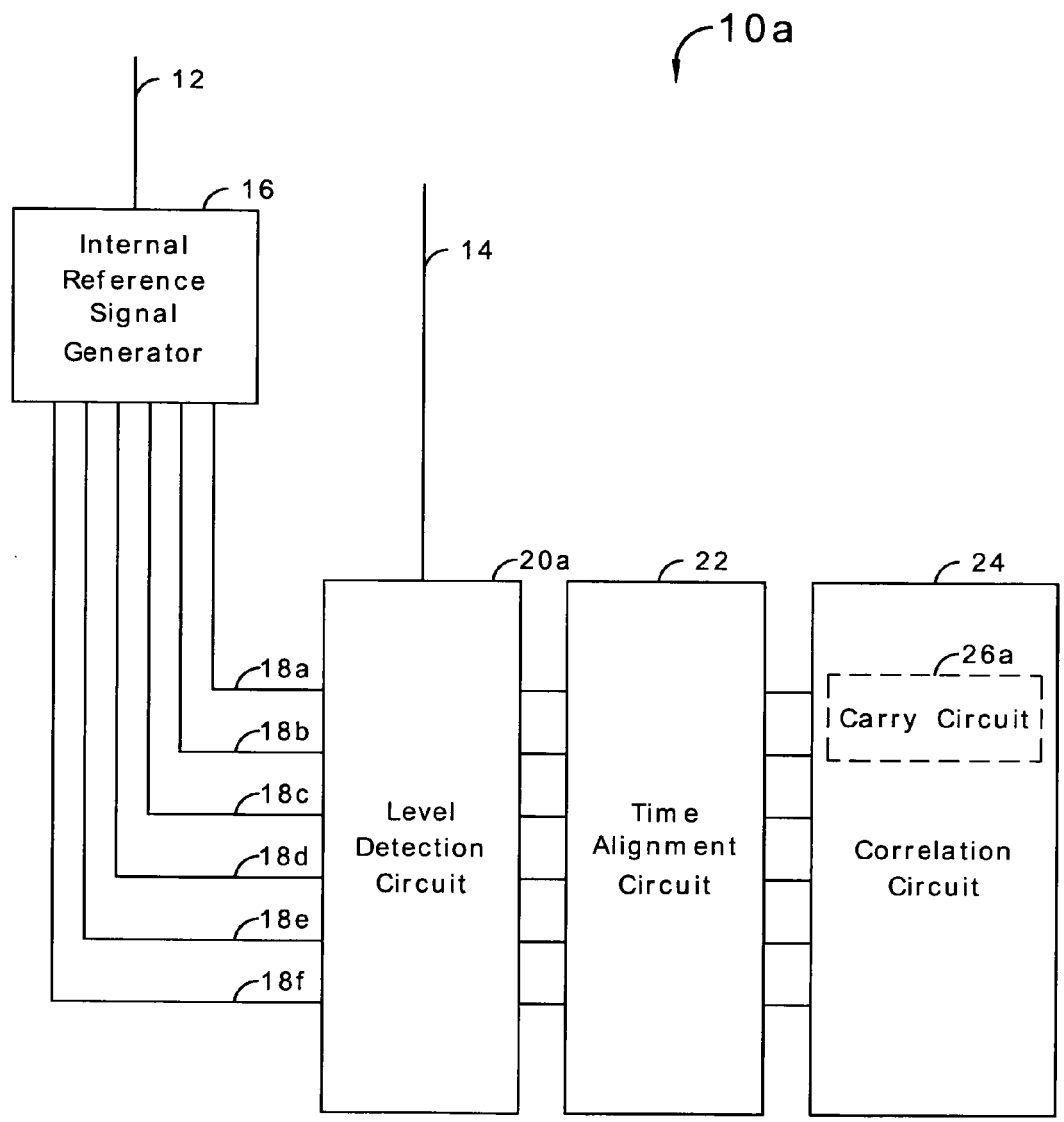
FIG. 1 is a schematic block diagram of a circuit used to perform frequency comparison.

FIG. 1 is a schematic block diagram of a circuit used to perform frequency comparison. A circuit 10a accepts a reference signal on an input 12 and an input signal on an input 14. An internal timing signal generator circuit 16 accepts the reference signal and generates a plurality of internal timing signals on the outputs 18a-f. In this case, six output lines for the internal timing signal generator 16 are denoted, but any number can be used, including a single output.

The internal timing signals generated by the internal timing signal generator 16 are based upon the incoming reference signal, and can be thought of as internally generated reference signals having some relationship to the input reference signal. In one embodiment, the internal timing signals are time-shifted variants of the original reference signal, thus subdividing the original reference signal. In one embodiment, these time-shifted variants are shifted by a particular phase according to the number of outputs of the internal time generator circuit 16. In this case, the outputs on the lines 18a-f could represent the reference signal offset by multiples of $\pm 2\pi/n$, where n represents the numbers of signals generated in the internal timing signal generator 16.

The internal timing signals may subdivide the reference signal evenly (or approximately thereabouts). Or, they may be subdivide the reference signal period in unequal intervals from one internal timing signal to the next, or any combination thereof of equal or unequal intervals. Additionally, the number of reference signals generated may differ from the number of lines through additional logic or other types of circuits, and/or the intervals between the internal timing signals.

Each of the internal timing signals are then coupled to a level detector circuit 20a. The level detector circuit 20a is coupled to the line 14, upon which the input signal is present. The internal timing signals can be used to clock or actuate the level detector circuit 20a. Thus, in this exemplary embodiment depicted in FIG. 1, a signal is present on each of the lines 18a-f at a particular time t(n), where n is the number of the internal timing signals and each t(n) is a different point in time. Accordingly, the input signal present on the line 14 is sampled at each of the times t(n) by the level detection circuit 20a.

As an example, in FIG. 1, the internal timing signal generator circuit 16 accepts the reference signal on the line 12 and can derive six signals differing in time from the reference and from one another. Each of these signals can be output on a differing line 18a-f. The level detection circuit 20a receives the input signal on the line 14, and accepts the signals on the lines 18a-f. In this manner, the outputs of the internal timing signal generator circuit 16 are used to actuate the level detection circuit 20a (or portions thereof) at a specific time. Thus, at time t(1), the level of the input signal on the line 14 is sampled by the level detector circuit 20a, the time t(1) being determined by the signal output by the internal timing signal generator circuit 16 on the line 18a. Correspondingly, the level detection circuit 20a samples the signal present on the line 14 at the differing times t(1) . . . t(f) using the internally generated reference signals.

The level detection circuit 20a is coupled to a time alignment circuit 22 via one or more lines. The time alignment circuit 22 takes the output or outputs of the level detection circuit, and produces an output that is a time-aligned version of the output or outputs of the level detection circuits 20a. In an exemplary embodiment, the time alignment circuit could be clocked by two differing mechanisms, thus allowing the time alignment circuit to run independent of the actuation constraints associated with the level detection circuit 20a. Accordingly, the output of the time alignment circuit 22 could be viewed as a vector of the input signal on the line 14 as sampled over time.

The outputs of the time alignment circuit 22 are coupled to a correlation circuit 24. The output or outputs of the time alignment circuit 22 may be transmitted to the correlation circuit over one line or over several lines. The correlation circuit 24 compares the output of the elements of time alignment circuit 22 (i.e. the levels associated with the input signal on the line 14 over time.)

A carry circuit 26a can be implemented to save values associated with previous outputs of the time alignment circuit 22. In this manner, the correlation circuit 24 can be used to compare both the values that have been sampled currently along with the values having been previously sent from the time alignment circuit 22.

Figure 2:
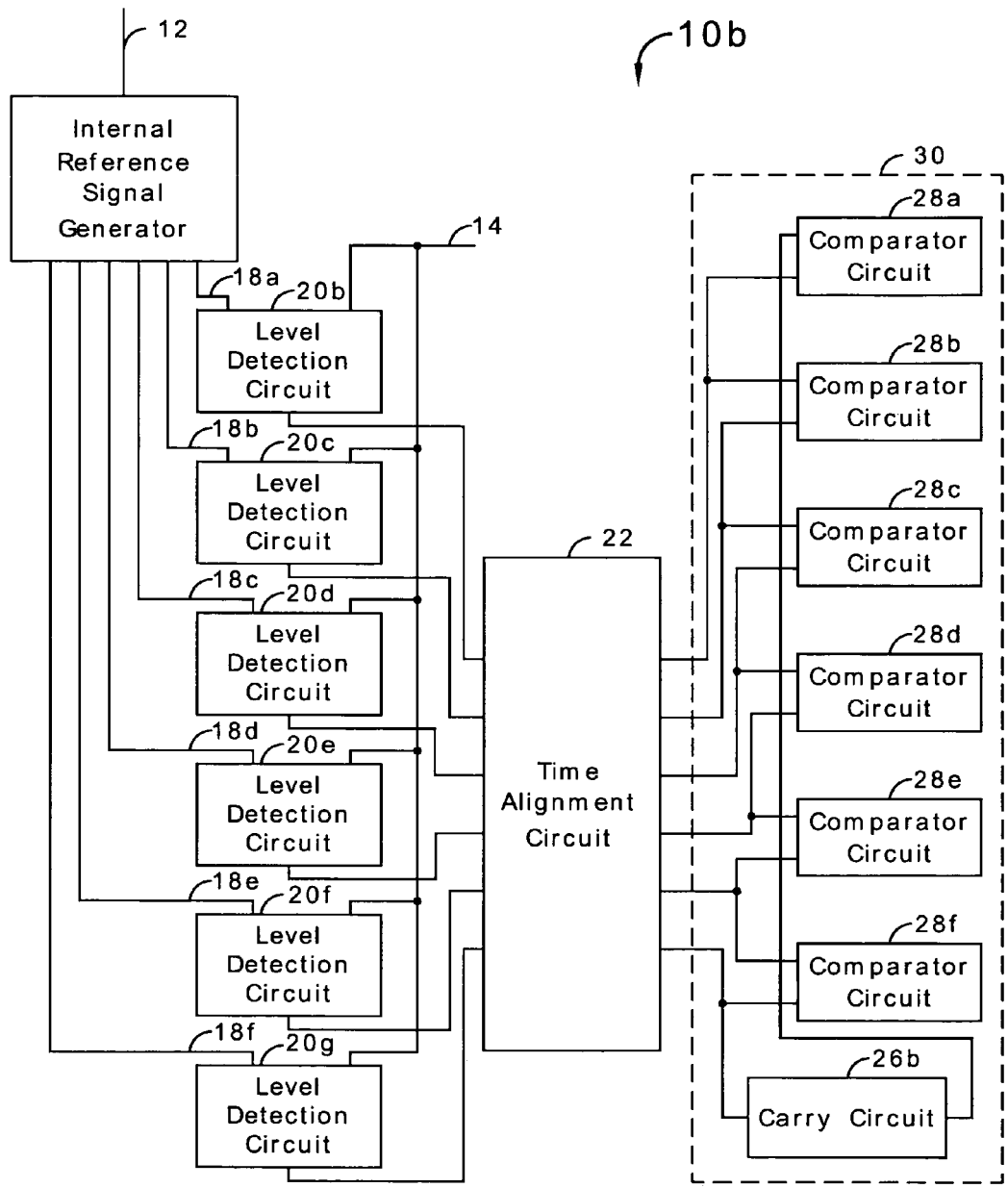
FIG. 2 is a schematic block diagram of a specific example of a circuit used to perform frequency comparison.

FIG. 2 is a schematic block diagram of a specific example of a circuit used to perform frequency comparison. A circuit 10b accepts a reference frequency signal on an input 12 and an input frequency signal on an input 14. The internal time generator circuit can operate much in the manner or manners described previously, or described in other portions of this description. Again, the number of outputs of the internal time generator circuit can be more or less than that depicted in FIG. 2.

In this embodiment, the internal timing signals can be coupled to an associated level detector circuit 20b-g. Each of the level detector circuits 20b-g is coupled to the line 14, on which the input signal is transmitted. The internal timing signals can then clock, or otherwise actuate, the level detectors 20b-g. Thus, in this exemplary embodiment, a signal on each of the lines 18a-f at a particular time t(n) represents an actuation of the associated level detection circuit 20b-g. Accordingly, the input signal present on the line 14 is sampled at each of the times t(n) into a separate level detection circuit 20b-g.

In implementations, it should be noted that the number of level detection circuits may differ from that shown in the specific embodiments. Further, it should be understood that the circuits may be controlled through other external circuitry to operate with less than the number present (i.e. setting a circuit with n level detection circuits to operate with n−2 internal timing signals and n−2 level detection circuits, here n is an integer representing the full number of level detection circuits in the apparatus.)

Each of the level detection circuits 20b-g is coupled to a time alignment circuit 22. The time alignment circuit 22 can produce an output that is a time-aligned version of the output of each of the level detection circuits 20b-g. In an exemplary embodiment, the time alignment circuit 22 could be clocked by two differing mechanisms, thus allowing the time alignment circuit to run independently of the actuation constraints associated with the level detection circuits 20b-g. For example, the time alignment circuit 22 could be subdivided into two or more partitions that are independently actuated. In one example, the first partition could be clocked with the signal the at time t(1). The second partition could be clocked with the signal at time t(4). Thus, the associated outputs of each of the level detection circuits 20b-g could be clocked into the time alignment circuit 22 at those times that would ensure that the signals from the associated level detection circuits are most likely to be stable. Accordingly, the output of the time alignment circuit 22 could be viewed as a time aligned version of each of the sampled signal during the sweep of the signals generated by the internal timing signal generator.

The output or outputs of the time alignment circuit 22 in FIG. 2 is/are coupled to associated comparator circuits 28a-f. In this implementation, each comparator circuit 28a-f can compare the output of the time-adjacent elements of the time-aligned sampled input signal. Accordingly, in this case, the output of each of the comparator circuits 28a-f gives an indication whether the input signal on the line 14 transitioned or stayed the same between the sample times.

In this embodiment, a carry circuit 26b is implemented to save the last sampled level of the time aligned version of the sampled input signal. This value can then compared to the first sampled level of the succeeding output of the time-aligned version of the sampled signal. This enables the apparatus 10b to compare all the values in the current output of the time alignment circuit, and selected values to selected values in preceding outputs of the time alignment circuit 22.

Accordingly, the block 30 could represent a signal transition detector. One should note that the signal transition detector can be operated at speeds much slower than the actuation (or deactivation) of adjacent internal timing signals. Thus, the signal transition detector 30 can be implemented to measure at intervals that exceed its own reference rate.

Again, note that external control circuitry may be used to operate the apparatus with less than the number of comparator circuits present. Further, note that the number of comparator circuits in the embodiment is arbitrary and may be the number as depicted, or any other integral number.

Figure 3:
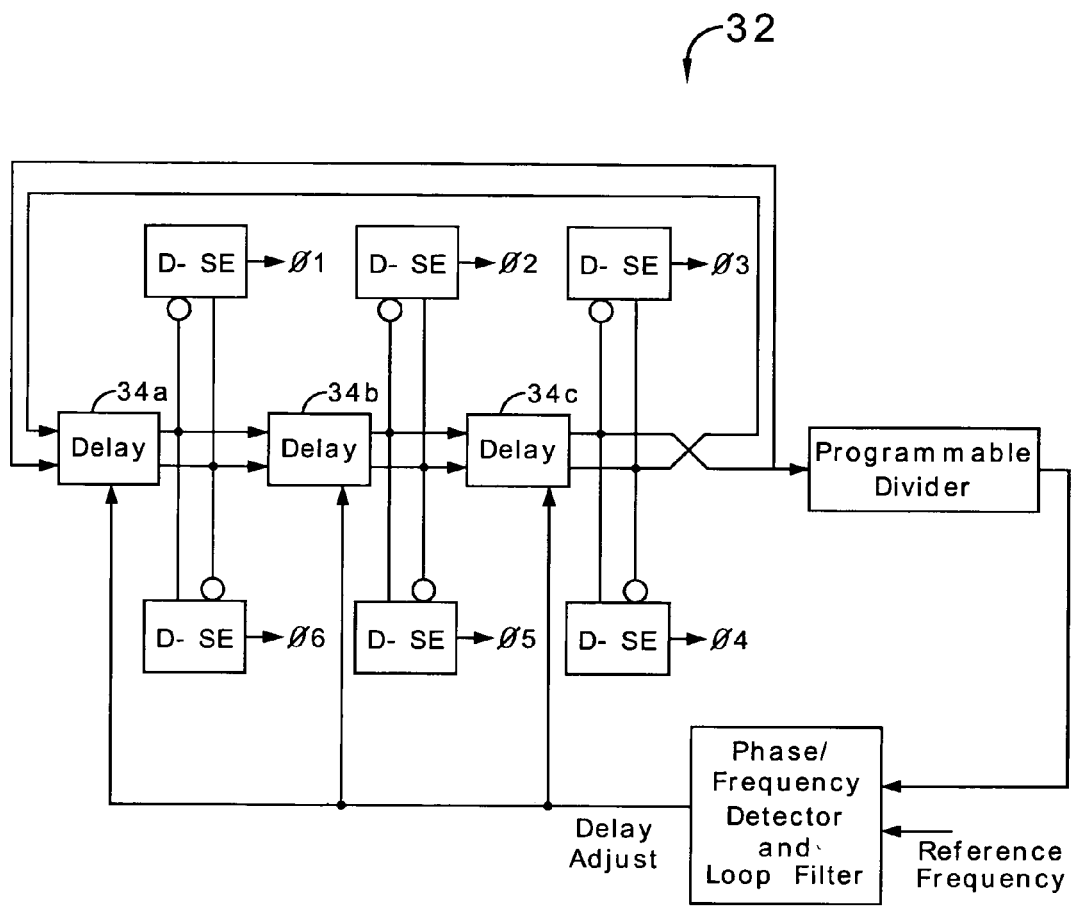
FIG. 3 is a schematic block diagram detailing a possible implementation of an internal timing circuit that can be used.

FIG. 3 is a schematic diagram detailing a possible implementation of an internal timing circuit that can be used. In this embodiment, an internal time generator circuit 32 accepts the reference signal and outputs a poly-phase signal that subdivides the period of the original reference signal. In this implementation, a reference signal is input into delay circuits 34a-c. Accordingly, in the exemplary embodiment depicted in FIG. 2, the internal time generator circuit 32 has six outputs. Thus, the output of the depicted delay circuits 34a-c could each represent ±nπ/3 phases, where n is an integer value between 0 and 6, inclusive. Of course, the particular delay can be performed with eight delay circuits as well (i.e. to work with the apparatus of FIG. 1 or FIG. 2), or several other numbers of delay circuits and delay lengths to accomplish the same result.

In this particular embodiment, a phase-locked loop is implemented to alter the delays in the circuits based upon a comparison of the output to the reference frequency. In this manner, this particular internal time generator circuit 32 subdivides the reference signal into a plurality of internal timing signals associated with the input reference signal.

It should be noted that the particular delay signals need not be generated in the serial manner as depicted. In other embodiments, some or all of the internal timing signals could be derived by elements placed in parallel as well as those placed in a serial fashion, like that depicted in FIG. 2. As noted before, the number of outputs of any implementation need not match the number depicted in this particular embodiment. And, of course, different delays could be associated with each delay element in order to produce a non-evenly distributed generated signal.

Figure 4:
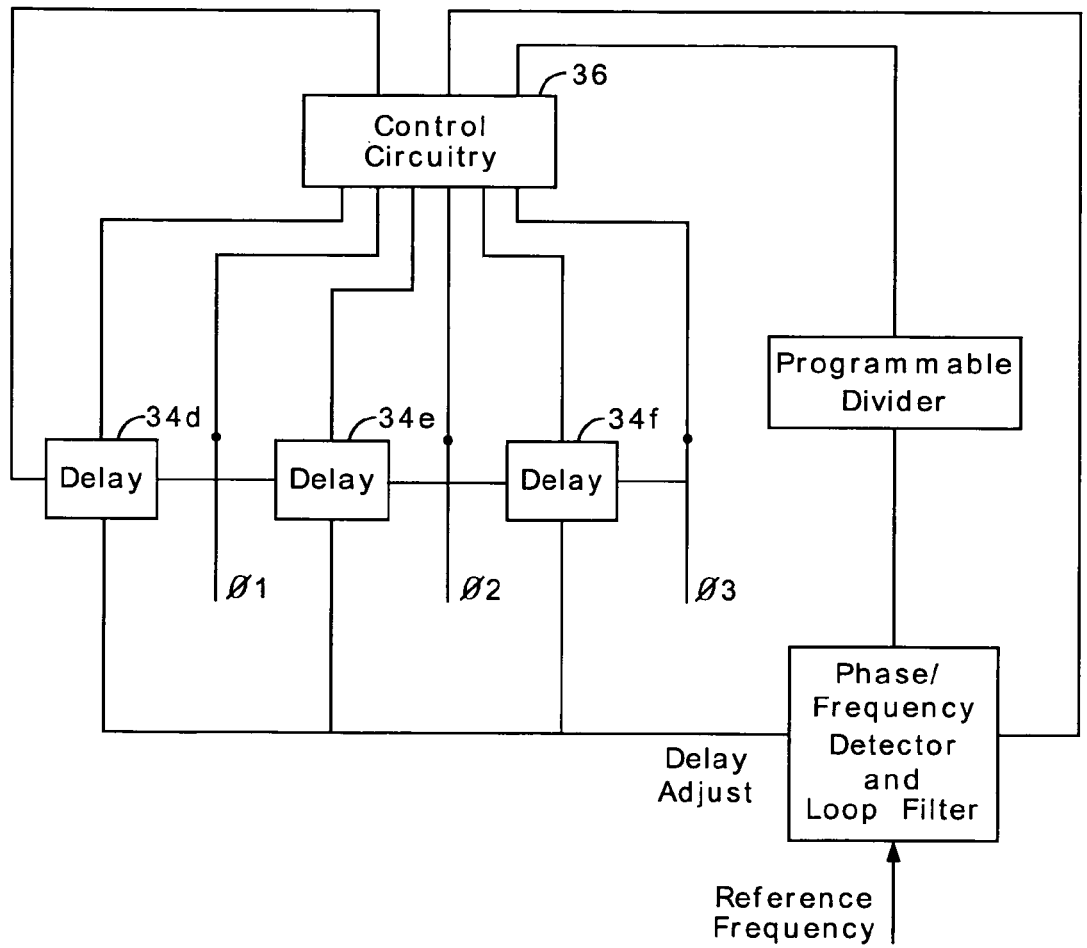
FIG. 4 is a schematic diagram detailing a possible implementation of an internal signal generator circuit.

FIG. 4 is a schematic diagram detailing a possible implementation of an internal timing generator circuit. In this case, the timing parameters of the outputs of an internal time generator circuit 32 are set not only by the delay circuits 34d-f themselves, but also by a control circuit 36. In this manner, the reference frequency can be input to the control circuit 36, and the control circuit 36 can set, test, and/or reset the specific delays or timing parameters associated with the delay circuits 34d-f. In this manner, the subdividing of the reference signal can be accomplished in a manner that does not require approximately set intervals between the internal timing signals, but the internal timing signals can be set to any interval as required by the user. Additionally, the control circuit 36 can be used to selectively actuate the nodes denoted by the delay circuits 34d-f, and reroute the timing pulses to each. In this manner, any specific subdivision, such as, for example, a 12-part subdivision or 13-part subdivision, of the reference signal can be achieved. Again, as noted before, the number of outputs of any implementation need not match the number depicted in this particular embodiment. Or, the control circuit 36 may be used without delay elements, and could generate the internal references by itself. One skilled in the art will realize many ways to generate a subdivided reference signal, and these should all be contemplated in the scope of this application.

Figure 5:
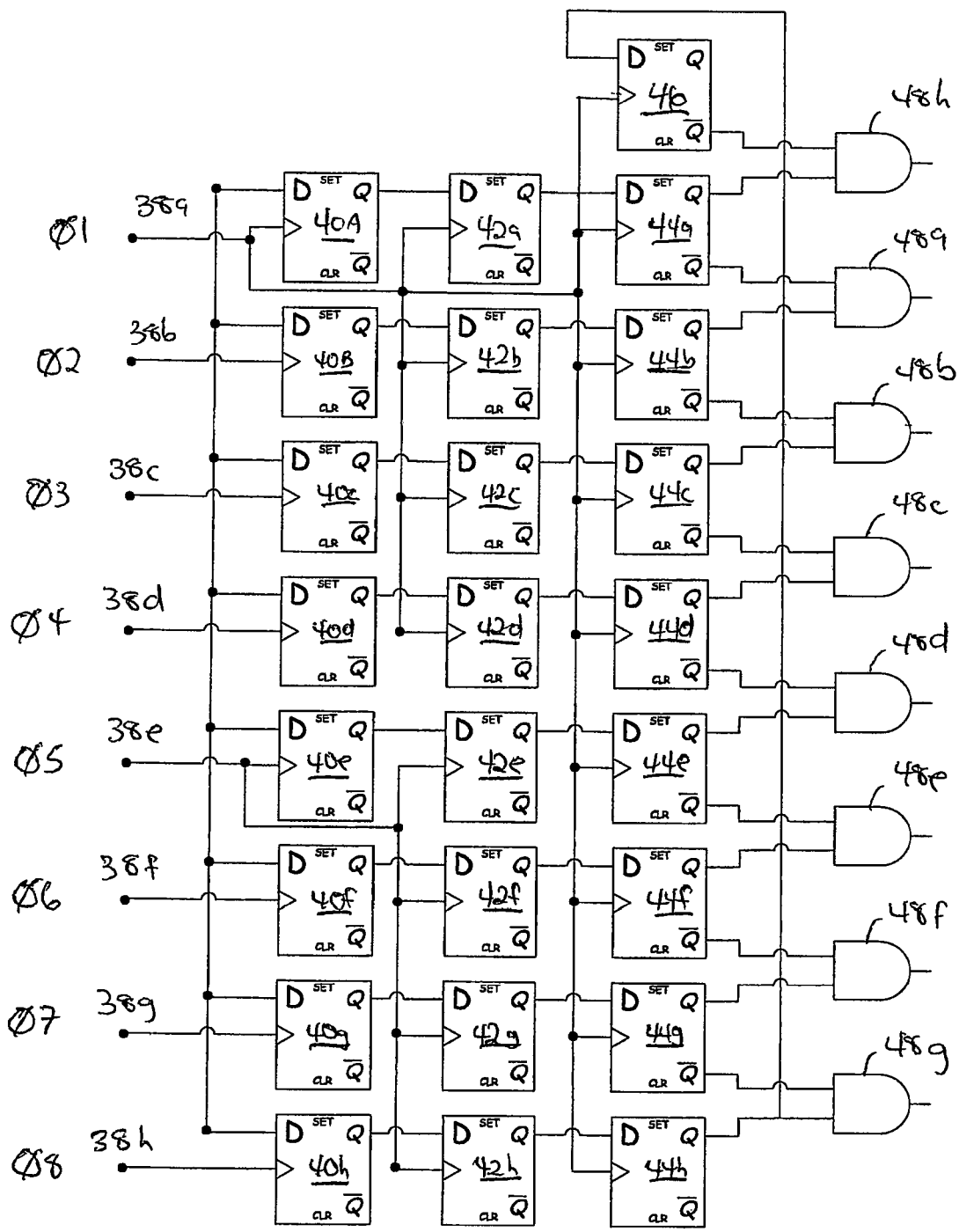
FIG. 5 is a schematic diagram of a specific embodiment of a frequency comparator.

FIG. 5 is a schematic diagram of a specific embodiment of a frequency comparator. In this case, the embodiment assumes that an internal reference generator circuit (not shown) produces a poly-phase signal with 8 outputs (i.e. each internal timing signal output 38 corresponds to the input reference signal leading or lagging by multiples of π/4.) Accordingly, in this case, the outputs 40a-h are actuated at times t(1) through t(8), where each t(n) is representative of a reference signal that lags by multiples of π/4 radians (At times, the subdivided signal at t(n) will be denoted as Φ(n).) Accordingly, t(1) lags the input reference signal by π/4 radians and t(8) lags the input reference signal by 8π/4 (or 2π) radians. Again, as stated earlier, other timing schemes can be implemented using different numbers of divisions and differing intervals between the internal timing signals, and these implementations should be construed as being disclosed in this context, as well as other contexts in this application.

The level detection circuits 40a-h can be implemented using such circuits as the D-latch flip-flops shown in FIG. 4. The poly-phase outputs 38a-h of the internal reference generator circuit are coupled to the associated level detection circuits 40a-h, with each poly-phase signal being coupled to the clock input of the associated flip-flop. Accordingly, when the associated poly-phase signal is received at the particular flip-flop, the level of the input signal is sampled at the flip-flop and stored. In this manner, as the internal reference generator circuit generates each output signal in succession, the flip-flops will be clocked and will store the level of the input signal with in them.

In this implementation, the time alignment can take place with a first level of flip-flops 42a-h and a second level of flip-flops 44a-h. In this implementation, the first bank of flip-flops 42a-d are clocked with the signal Φ1, and the second bank of flip-flops 42e-h are clocked with the signal Φ5. Accordingly, the contents of the level detection circuits 40a-d are stored in the associated flip-flops 42a-d and the level detection circuits 40e-h are stored in the associated flip-flops 42e-h in a manner that preserves the time information of the system without interrupting the continued operation of the system.

In a related manner, each of the second level of flip-flops 44a-h is coupled to an associated flip-flop 42a-h, and the contents of each of the first level of flip-flops 42a-h are transferred to the appropriate portion of the second level of flip-flops 44a-h. In this example, this transfer is clocked by the signal Φ1. In this manner, the time alignment of the cycle has been completed, and the contents of the second level of flip-flops 44a-h indicate a vector representing the level of the input signal at a time in the cycle of the reference signal.

To aid in further use of this information, a carry-over flip-flop 46 is present. The input to this carry-over flip-flop 46 is the output of the second level flip-flop 44h (i.e. the value of the input signal within the last sample point in the previous cycle.) This carry-over flip-flop 46 is clocked by the same signal that the second level flip-flop 44a-h. In this manner, the time-aligned vector of sampled points can be constructed.

Of course, the above-described architecture is not an exclusive architecture to perform a time alignment of the sampled signal. Other schemes and architectures can be imagined using various combinations of logic, timing signals, and/or electronic storage mechanisms can be imagined in the construction of the time-alignment portion of the circuit depicted in FIG. 5, and accordingly these alternative constructions and architectures should be considered within the scope of this description.

In the implementation of FIG. 5, the inverse of the sample at t1 and the sample at t2 are coupled to an AND-gate 48a. Thus, when the samples at time t1 and t2 are the same, the AND-gate indicates that the level has not changed with a logical LOW. If the samples at t1 is a logical LOW and the sample at t2 is a logical HIGH, the AND gate that is coupled in the above-described fashion will indicate a logical HIGH signal, thus indicating that the sample has transitioned from a logical LOW to a logical HIGH.

A succession of AND gates 48a-g are coupled to indicate this logical function. Accordingly, anywhere the sample transitions from a LOW state to a HI state, the corresponding AND gate will register this transition. Additionally, an AND gate 48h is coupled between the carry-over flip-flop and the flip-flop corresponding to time t1 in the new sequence. Thus, a transition between a LOW state in the last element of the previous vector and a HIGH state in the first element of the present vector will register as a transition. The collection of the AND-gates 48a-h can be viewed as a vector representation of logical transitions within one complete phase of the reference signal, and with an overlap containing information relating to one or more previous phases.

Of course, various logical units or functions can be implemented to detect various transitions, and the sampled levels can be wired in various ways to detect various transitions. For example, XOR gates can be coupled to the outputs of adjacent cells to indicate a transition, albeit not the sign of the change. Again, many architectural options can be used to determine the existence transitions or the direction of the transition. Again, these alternative implementations should be considered within the scope of this disclosure. Further, the implementation of the time-alignment function need not use persistent logic as depicted in FIG. 5.

Figure 6:
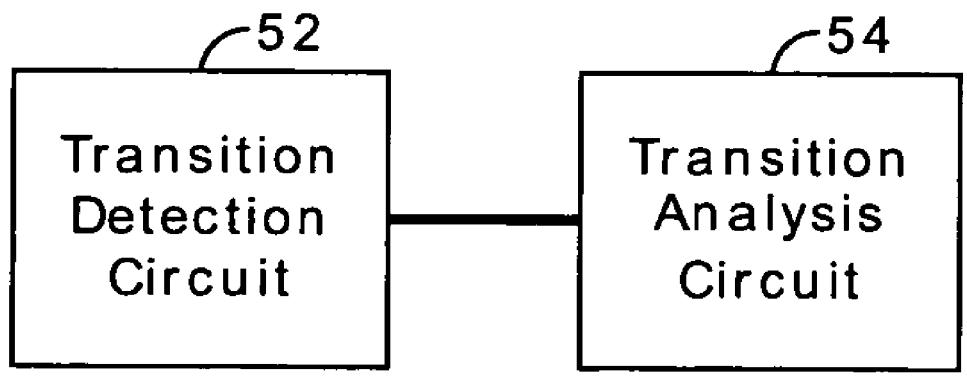
FIG. 6 is a schematic block diagram of a further embodiment of a usage of the transition detection circuit.

FIG. 6 is a schematic block diagram of a further embodiment of a usage of the transition detection circuit. In FIG. 6 a transition detection circuit 52 is coupled to a transition analysis circuit 54. The transition detection circuit may be any of those as described previously, or an alternative architecture that has as a reference, at least one sample input, and several outputs indicating transitions between the input clocks. The transition analysis circuit can accept the outputs of the transition detection circuit 52 indicating transitions between the input clocks. Upon receiving such information, the transition analysis circuit can perform an analysis amongst the transitions that are detected thereon.

Figure 7:
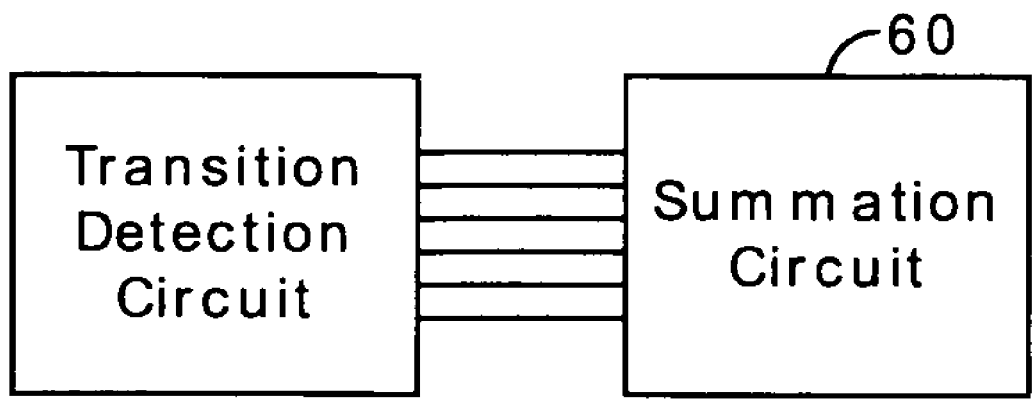
FIG. 7 is a schematic block diagram detailing of a possible interaction between a transition detection circuit and a transition analysis circuit.

FIG. 7 is a schematic diagram of an embodiment of the interaction between a transition detection circuit and a transition analysis circuit. First, the vector having the results of the transition detection made in accordance with the internal timing signals is made available to a transition analysis circuit 60. In this case, the analysis can be implemented as a summation circuit. Thus, the numbers of transitions of the sampled signal within the interval defined by internal timing signals generated by the timing signal generator are recorded. This result can be used instantaneously or passed along to other circuits for further analysis.

FIGS. 8a-b are schematic diagrams of an embodiment of the interaction between a result of the transition detection circuit and a transition analysis circuit. In this case, the vector having the results of the transition detection made in accordance with the inner reference signals is made available to a transition analysis circuit. The transition analysis circuit 60 may derive a spacing value between the transitions. In FIG. 8a, the analysis circuit has determined the spacings within the reference frame, and stored a remainder indicating the last number of cells that no transition has occurred.

In FIG. 8b, a new vector is made available, and the number of inter-frame transitions is tabulated. In addition, the preceding cells prior to the first transition are analyzed to determine the "distance" between the frame start and the first transition. This result is combined with the previous determination in the previous frame of the "distance" between the end of the preceding frame and the last transition therein. Thus, the "distance" between the inter-frame transitions and the transition distances between frames can be determined.

A poly-phase transition analysis circuit can also coupled to a filter. This filter can add a history aspect to the captured transition vectors, the numbers of transitions, and/or the inter-transition spacing. In one embodiment, where a summation is made of the transitions within the frame, this sum is fed to a filter that produces an average (or weighted average) of the transitions in relation to the reference input. Accordingly, a ratio of the reference signal to the input signal can be garnered over time. This can be used with the embodiment capturing the spacing between pulses as well, to produce a slightly different aspect of the relationship. Further, a comparison of the input signal to the reference signal produces a linear function of the input frequency, and accordingly this information allows both a magnitude and a direction to be applied for any frequency correction to the system.

FIG. 9 is a schematic block diagram of the transition detection and analysis circuits used in conjunction with a low-pass filter. The use of a low-pass filter coupled to the transition detection and analysis circuits allow the long-term characteristics of the relationship between the input signal and reference signal to predominate. Many types of filters could be used with this system to produce an output over time. An averaging filter, weighted average filter, and a Bartlett tap filter are all types of filters that could be used to produce an output showing the longer-term characteristics of the system. Such specific low-pass filters are, of course, exemplary in nature, and other types of low-pass filters are contemplated within the scope of this description.

FIG. 10 is a detailed schematic of a specific embodiment of an apparatus that determines an input frequency. In this particular embodiment, the low-pass filter is a 256 tap Bartlett filter, and eight approximately equal spaced internal timing signals are used.

FIG. 11 is a graph detailing an exemplary output of FIG. 10. Note the linearity of the system with respect to the output.

FIG. 12 is another detailed schematic of a specific embodiment of an apparatus that determines an input frequency. In this embodiment, seven phases are generated, thus exemplifying that the system is not limited to an even number of phases.

FIG. 13 is a plot of the output digital word for the seven phase system depicted in FIG. 12. In this manner, it should be apparent that many differing numbers of phases (including those not easily divisible in a complete cycle) could be used for the apparatus without detriment to the overall functionality.

FIG. 14 is a schematic diagram of yet another embodiment of a transition detection/frequency comparator. In this embodiment, both the up and the down transitions are noted and recorded, and can be used for further analysis. In this embodiment, the function is measured through the use of XOR gates. One skilled in the art will realize that other designs are possible with other types of logic circuits.

FIG. 15 is schematic block diagram of a system coupled to an integration circuit. Since the integral of the output will result in a phase difference (as opposed to a frequency difference), the coupled system can be utilized to produce a linear phase difference between the signals. Thus, a linear frequency comparator and a linear phase difference can be obtained with the same digital components.

FIG. 16 is a schematic block diagram of a frequency comparator in a frequency synthesizer. In this manner, the preceding circuits can be used to help match any input frequency to a reference, or vice versa.

FIGS. 17a-b are schematic diagrams detailing the use of the circuits in place in wireless apparatuses. Note, that both the receivers and transmitters, whether they are in a handheld unit or in a base station, all require the monitoring and calibration of a signal to a reference in order to operate correctly.

FIGS. 18a-b are schematic diagrams detailing the use of the circuits in place in modems. Most modems require upconverting and downconverting modulated signals. Thus, the circuits described supra can be used quite effectively in these types of devices.

Thus, an apparatus and method for determining an input frequency is described and illustrated. Those skilled in the art will recognize that many modifications and variations of the present invention are possible without departing from the invention. Of course, the various features depicted in each of the Figures and the accompanying text may be combined together. Accordingly, it should be clearly understood that the present invention is not intended to be limited by the particular features specifically described and illustrated in the drawings, but the concept of the present invention is to be measured by the scope of the appended claims. It should be understood that various changes, substitutions, and alterations could be made hereto without departing from the spirit and scope of the invention as described by the appended claims that follow.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

The invention claimed is:

1. A method of determining a relationship between an input signal frequency and a reference signal frequency, the reference frequency having a first period, the method comprising:
    deriving from the reference signal a plurality of internal reference signals, each of the internal reference signals characterized with each of the internal reference signals being temporally offset from one another and occurring within the first period;
    providing each of the plurality of internal reference signals to a level detection circuit;
    based upon a characteristic of any of the plurality of internal reference signals, sampling, with the level detection circuit, a plurality of signal levels of the input signal within the first period;
    providing an output of the level detection circuit to a time alignment circuit, the time alignment circuit being configured to produce an output which is a time-aligned version of the output of the level detection circuit;
    storing a value indicative of each of the sampled levels taken in the first period;
    storing one value indicative of a sampled level of the input signal from a previous period;
    correlating the sampled levels from the first period amongst themselves;
    correlating the one value indicative of a sampled level from the first period with the value indicative of a sampled level from the previous period; and
    deriving a relationship between the input signal frequency and the reference signal frequency based in part on: a) the step of correlating the sampled signal levels from the first period; and b) the step of correlating the one value indicative of the sampled level from the first period with the value indicative of the sampled level from the previous period.

2. A circuit for determining a relationship between an input signal having a first frequency on an input port and a reference signal having a second frequency on a reference port comprising:
    an internal timing signal generator, coupled to the reference port, operable to generate multiple signals at specific points in time within a first period of time, the first period of time related to the reference signal frequency;
    a plurality of signal level detectors, each of the plurality of signal level detectors coupled to an output of the internal timing signal generator and the input port and having a first output, each of the signal level detectors operable to sample the input signal at a first point in time based upon an output of the internal timing signal generator and output a first value associated with the sampled input signal, the first point in time being within the first period;

a time alignment circuit, coupled to the plurality of signal level detectors, configured to produce a plurality of outputs which are a time-aligned version of outputs of the plurality of the signal level detectors;

a storage circuit, operable to store a value associated with a sampled input signal from a second point in time, the second point in time being previous to the first period; and a correlator circuit, coupled to the time alignment circuit and the storage circuit, operable to: a) correlate the first values from the first period amongst themselves; and b) correlate the value associated with a sampled input signal from the second point in time with one of the first values.

3. A circuit for determining a relationship between an input signal having a first frequency on an input port and reference signal having a second frequency on a reference port, the circuit comprising:

a signal offset circuit, coupled to the reference port, for generating a plurality of offset reference signals on a plurality of ports, the offset reference signals subdividing a first period of time, the first period of time related to the second frequency;

a plurality of signal detection circuits, each coupled to one of the plurality of reference offset ports, each operable to sample the input signal at a particular point in response to a particular offset reference signal and produce a first signal associated with the level of the input signal at the particular point in time;

a time alignment circuit, coupled to the plurality of signal detection circuits, configured to produce a plurality of outputs which are a time-aligned version of outputs of the plurality of the signal detection circuits;

a plurality of storage circuits, each coupled to an associated one of the plurality of signal detection circuits, each operable to store the first signal from the associated signal detector circuit;

a carryover circuit, operable to store a first signal from one of the plurality of storage circuits associated with a second time, the second time being previous to the first period;

a plurality of first transition detection circuits, each coupled to a pair of storage circuits from among the plurality of storage circuits, each operable to detect a change between the stored first signals in the pair of storage circuits;

a second transition detection circuit, coupled to a particular first storage circuit from the plurality of storage circuits and to the carryover circuit, operable to detect a change between the stored first signal in the first storage circuit and the stored signal in the carryover circuit;

a transition aggregation circuit, coupled to the plurality of first transition detection circuits and to the second transition detection circuit, operable to produce a signal related to the number of changes in the stored signals; and a digital filter, coupled to the transition aggregation circuit, operable to produce an average of the number of transitions over a history of periods.

4. The method of claim 1, wherein the time alignment circuit is further configured to be clocked by two different mechanisms.

5. The circuit of claim 2, wherein the time alignment circuit is further configured to be clocked by two different mechanisms.

6. The circuit of claim 3, wherein the time alignment circuit is further configured to be clocked by two different mechanisms.

* * * * *